US009818912B2

(12) United States Patent
Lunev et al.

(10) Patent No.: US 9,818,912 B2
(45) Date of Patent: Nov. 14, 2017

(54) ULTRAVIOLET REFLECTIVE CONTACT

(71) Applicant: Sensor Electronic Technology, Inc., Columbia, SC (US)

(72) Inventors: Alexander Lunev, Columbia, SC (US); Alexander Dobrinsky, Loudonville, NY (US); Maxim S. Shatalov, Columbia, SC (US); Remigijus Gaska, Columbia, SC (US); Michael Shur, Latham, NY (US)

(73) Assignee: SENSOR ELECTRONIC TECHNOLOGY, INC., Columbia, SC (US)

( * ) Notice: Subject to any disclaimer, the term of this patent is extended or adjusted under 35 U.S.C. 154(b) by 0 days.

(21) Appl. No.: 14/934,482

(22) Filed: Nov. 6, 2015

(65) Prior Publication Data

US 2016/0155902 A1 Jun. 2, 2016

Related U.S. Application Data

(63) Continuation-in-part of application No. 13/711,675, filed on Dec. 12, 2012, now Pat. No. 9,184,346.
(Continued)

(51) Int. Cl.
*H01L 33/40* (2010.01)
*H01L 33/32* (2010.01)
(Continued)

(52) U.S. Cl.
CPC ........... *H01L 33/405* (2013.01); *H01L 33/32* (2013.01); *H01L 33/387* (2013.01); *H01L 33/42* (2013.01);
(Continued)

(58) Field of Classification Search
CPC ......... H01L 29/20; H01L 29/45; H01L 33/32; H01L 29/2003; H01L 33/42;
(Continued)

(56) References Cited

U.S. PATENT DOCUMENTS 5,917,202 A   6/1999 Haitz et al.
6,969,874 B1  11/2005 Gee et al.
(Continued)

FOREIGN PATENT DOCUMENTS

EP   1168460 A2   1/2002
EP   1530242 A2   5/2005
(Continued)

OTHER PUBLICATIONS

Japanese Application No. JP 2014-547358, Office Action1, dated Sep. 20, 2016, 7 pages.
(Continued)

*Primary Examiner* — Thanh T Nguyen
(74) *Attorney, Agent, or Firm* — Labatt, LLC

(57) ABSTRACT

A contact including an ohmic layer and a reflective layer located on the ohmic layer is provided. The ohmic layer is transparent to radiation having a target wavelength, while the reflective layer is at least approximately eighty percent reflective of radiation having the target wavelength. The target wavelength can be ultraviolet light, e.g., having a wavelength within a range of wavelengths between approximately 260 and approximately 360 nanometers.

20 Claims, 8 Drawing Sheets

Related U.S. Application Data

(60) Provisional application No. 61/569,416, filed on Dec. 12, 2011.

(51) Int. Cl.
*H01L 33/42* (2010.01)
*H01L 33/24* (2010.01)
*H01L 33/38* (2010.01)
*H01L 33/46* (2010.01)

(52) U.S. Cl.
CPC .............. *H01L 33/24* (2013.01); *H01L 33/38* (2013.01); *H01L 33/46* (2013.01)

(58) Field of Classification Search
CPC ................... H01L 33/405; H01L 33/06; H01L 2933/0041; H01L 33/50; H01L 33/0025; H01L 33/007; H01L 33/08; H01L 33/46; H01L 33/502; H01L 33/504; H01L 21/02458; H01L 21/0254; H01L 2924/12041; H01L 33/24; H01L 31/101; H01L 2224/83874; H01L 25/167; H01L 29/452; H01L 29/78681
See application file for complete search history.

(56) References Cited

U.S. PATENT DOCUMENTS

| | | | |
|---|---|---|---|
| 6,992,334 | B1 | 1/2006 | Wierer, Jr. et al. |
| 7,193,249 | B2 | 3/2007 | Seong et al. |
| 7,262,436 | B2 | 8/2007 | Kondoh et al. |
| 7,319,247 | B2 | 1/2008 | Bader et al. |
| 7,335,924 | B2 | 2/2008 | Liu et al. |
| 7,355,212 | B2 | 4/2008 | Okazaki et al. |
| 7,485,479 | B2 | 2/2009 | Seong et al. |
| 7,501,295 | B2 | 3/2009 | Zhou |
| 7,611,915 | B2 | 11/2009 | Slater, Jr. et al. |
| 7,612,384 | B2 | 11/2009 | Zhou |
| 7,687,822 | B2 | 3/2010 | Nagai et al. |
| 7,691,659 | B2 | 4/2010 | Bader et al. |
| 7,714,340 | B2 | 5/2010 | Chua et al. |
| 7,829,359 | B2 | 11/2010 | Tang et al. |
| 7,872,272 | B2 | 1/2011 | Bour et al. |
| 7,915,624 | B2 | 3/2011 | Jorgenson |
| 7,973,325 | B2 | 7/2011 | Kim et al. |
| 7,985,979 | B2 | 7/2011 | David et al. |
| 8,304,792 | B2 | 11/2012 | Nakai et al. |
| 8,729,583 | B2 | 5/2014 | Katsuno et al. |
| 9,184,346 | B2 * | 11/2015 | Lunev .................... H01L 33/32 |
| 2003/0209720 | A1 | 11/2003 | Okazaki et al. |
| 2004/0119082 | A1 | 6/2004 | Sugawara |
| 2005/0040420 | A1 | 2/2005 | Okazaki et al. |
| 2005/0087884 | A1 | 4/2005 | Stokes et al. |
| 2006/0071226 | A1 | 4/2006 | Kojima et al. |
| 2006/0102920 | A1 * | 5/2006 | Song ................. H01L 21/28575 257/99 |
| 2006/0186552 | A1 | 8/2006 | Venugopalan |
| 2007/0161137 | A1 | 7/2007 | Slater, Jr. et al. |
| 2007/0170441 | A1 | 7/2007 | Takizawa et al. |
| 2008/0048194 | A1 | 2/2008 | Kudo et al. |
| 2008/0144688 | A1 | 6/2008 | Chua et al. |
| 2009/0134419 | A1 | 5/2009 | Zhou |
| 2010/0264440 | A1 | 10/2010 | Park |
| 2012/0146047 | A1 | 6/2012 | Kneissl et al. |

FOREIGN PATENT DOCUMENTS

| | | | |
|---|---|---|---|
| JP | 2002026392 | A | 1/2002 |
| JP | 2004200431 | A | 7/2004 |
| JP | 2006278554 | A | 10/2006 |
| JP | 2007081368 | A | 3/2007 |
| JP | 2007103690 | A | 4/2007 |
| JP | 2007235100 | A | 9/2007 |
| JP | 2007273849 | A | 10/2007 |
| JP | 2007318157 | A | 12/2007 |
| JP | 2009260246 | A | 11/2009 |
| JP | 2010267797 | A | 11/2010 |
| JP | 2011151086 | A | 8/2011 |
| JP | 2011187873 | A | 9/2011 |
| WO | 2011006995 | A1 | 1/2011 |

OTHER PUBLICATIONS

Ban et al., "Ir—Ag reflector for high-performance GaN-based near UV light emitting diodes," Materials Science and Engineering B 133, Aug. 2006, pp. 26-29, Elsevier B.V.

Ban et al., "Use of an indium zinc oxide interlayer for forming Ag-based Ohmic contacts to p-type GaN for UV-light-emitting diodes," Semiconductor Science and Technology Sep. 20, 2005, pp. 921-924, No. 9, IOP Publishing Ltd.

Chang et al., "High reflective p-Gan—Ni—Ag—Ti—Au Ohmic contacts for flip-chip light-emitting diode (FCLED) applications," Applied Surface Science 255, Apr. 2009, pp. 6155-6158, No. 12, Elsevier B.V.

Chen et al., "Highly Reflective Ag—La Bilayer Ohmic Contacts to p-Type GaN," Journal of the Electrochemical Society 158, 2011, pp. H285-H288, No. 3, The Electrochemical Society.

Chen et al., "High-reflectivity Pd—Ni—Al—Ti—Au ohmic contacts to p-type GaN for ultraviolet light-emitting diodes," Applied Physics Letters, Oct. 2004, pp. 2797-2799, vol. 85, No. 14, American Institute of Physics.

Chou et al., "High thermally stable Ni—Ag(Al) alloy contacts on p-GaN," Applied Physics Letters 90, 2007, pp. 022103-1-022103-3, No. 2, American Institute of Physics.

Chu et al., "Low-resistance ohmic contacts on p-type GaN using Ni—Pd—Au metallization," Applied Physics Letters, Nov. 2000, pp. 3423-3425, vol. 77, No. 21, American Institute of Physics.

Fung et al., "A study of the electrical characteristics of various metals on p-type GaN for ohmic contacts," Journal of Electronic Materials, 1999, pp. 572-579, vol. 28, No. 5.

Jang et al., "Formation of High-Quality Ag-Based Ohmic Contacts to p-Type GaN," Journal of the Electrochemical Society 155, 2008, pp. Jan. 1563-H568, No. 8, The Electrochemical Society.

Jang et al., "Highly reflective low resistance Ag-based Ohmic contacts on p-type GaN using Mg overlayer," Applied Physics Letters 90, 2007, pp. 012106-1-012106-3, American Institute of Physics.

Jang et al., "Low-resistance and thermally stable ohmic contact on p-type GaN using Pd—Ni metallization," Applied Physics Letters, Sep. 2001, pp. 1822-1824, vol. 79, No. 12, American Institute of Physics.

Jang et al., "Low-resistance Pt—Ni—Au ohmic contacts to p-type GaN," Applied Physics Letters, Jan. 1999, pp. 70-72, vol. 74, No. 1, American Institute of Physics.

Jang et al., "Mechanism for ohmic contact formation of Ni—Ag contacts on p-type GaN," Applied Physics Letters, Dec. 2004, pp. 5920-5922, vol. 85, No. 24, American Institute of Physics.

Jang et al., "Mechanisms for the reduction of the Schottky barrier heights of high-quality nonalloyed Pt contacts on surface-treated p-GaN," Journal of Applied Physics, Sep. 2000, pp. 3064-3066, vol. 88, No. 5, American Institute of Physics.

Jang et al., "Ohmic contacts to p-type GaN using a Ni—Pt—Au metallization scheme," Journal of Vacuum Science & Technology B: Microelectronics and Nanometer Structures, 1998, pp. 3105-3107, vol. 16, No. 6, American Vacuum Society.

Jang et al., "The role of reflective p-contacts in the enhancement of light extraction in nanotextured vertical InGaN light-emitting diodes," Nanotechnology 21, Jan. 2010, pp. 1-5 025203, IOP Publishing Ltd.

Jung et al., "Improved electrical and thermal properties of Ag contacts for GaN-based flip-chip light-emitting diodes by using a NiZn alloy capping layer," Superlattices and Microstructures 46, Oct. 2009, pp. 578-584, No. 4, Elsevier Ltd.

Jung et al., "Improved Light Output of GaN-Based Light-Emitting Diodes by Using AgNi Reflective Contacts," Journal of Electronic Materials, Sep. 2011, pp. 2173-2178, vol. 40, No. 11, TMS.

(56) References Cited

OTHER PUBLICATIONS

Hagio et al., "Interface Properties between Ni and p-GaN Studied by Photoemission Spectroscopy," Japanese Journal of Applied Physics, Apr. 2002, pp. 2493-2496, vol. 41, Part 1, No. 4B, The Japan Society of Applied Physics.
Hibbard et al., "Low resistance high reflectance contacts to p-GaN using oxidized Ni—Au and Al or Ag," Applied Physics Letters, Jul. 2003, pp. 311-313, vol. 83, No. 2, American Institute of Physics.
Hong-Xia et al., "A Novel Ni—Ag—Pt Ohmic Contact to P-Type GaN for Flip-Chip Light-Emitting Diodes," Chinese Physics Letters, Aug. 2006, pp. 2299-2302, vol. 23, No. 8, Chinese Physical Society and IOP Publishing Ltd.
Horng et al., "Low-resistance and high-transparency Ni—indium tin oxide ohmic contacts to p-type GaN," Applied Physics Letters, Oct. 2001, pp. 2925-2927, vol. 79, No. 18, American Institute of Physics.
Hwang et al., "Electrical and thermal stability of Ag ohmic contacts for GaN-based flip-chip light-emitting diodes by using an AgAl alloy capping layer," Materials Science in Semiconductor Processing 10, Feb. 2007, pp. 14-18, Elsevier Ltd.
Kim et al., "Highly Reflective and Low-Resistant Ni—Au—ITO—Ag Ohmic Contact on p-Type GaN," Electrochemical and Solid-State Letters 7, 2004, pp. G102-G104, No. 5, The Electrochemical Society.
Kim et al., "High-reflectivity Al—Pt nanostructured Ohmic contact to p-GaN," IEEE Transactions on Electron Devices, Oct. 2006, pp. 2448-2453, vol. 53, No. 10, IEEE.
Kim et al., "Low resistance contacts to p-type GaN," Mater. Res. Soc. Symp. Proc., 1997, pp. 427-430, vol. 468, Materials Research Society.
Kim et al., "Low-resistance and highly transparent Ag—IZO ohmic contact to p-type GaN," Thin Solid Films 517, 2009, pp. 4039-4042, No. 14, Elsevier B.V.
Kim et al., "Performance characteristics of GaN-based light-emitting diodes fabricated with AgNi, AgCu, and AgAl-alloy reflectors," Journal of Vacuum Science and Technology B: Microelectronics and Nanometer Structures 29, 2011, pp. 011032-1-011032-5, No. 1, American Vacuum Society.
Leem et al., "Formation of High-Quality Ohmic Contacts to p-GaN for Flip-Chip LEDs Using Ag/TiN[sub x]/Al," Electrochemical and Solid-State Letters 8, 2005, pp. G150-G152, No. 6, The Electrochemical Society.
Lin et al., "Nitride-based light-emitting diodes with Ni/ITO p-type ohmic contacts," IEEE Photonics Technology Letters, Dec. 2002, pp. 1668-1670, vol. 14, No. 12, IEEE.
Margalith et al., "Indium tin oxide contacts to gallium nitride optoelectronic devices," Applied Physics Letters, Jun. 1999, pp. 3930-3932, vol. 74, No. 26, American Institute of Physics.
Nakahara et al., "Improved External Efficiency InGaN-Based Light-Emitting Diodes with Transparent Conductive Ga-Doped ZnO as p-Electrodes," Japanese Journal of Applied Physics, Jan. 2004, pp. L180-L182, vol. 43, No. 2A, The Japan Society of Applied Physics.
Pan et al., "Enhanced output power of InGaN—GaN light-emitting diodes with high-transparency nickel-oxide-indium-tin-oxide ohmic contacts," IEEE Photonics Technology Letters, May 2003, pp. 646-648, vol. 15, No. 5, IEEE.
Park et al., "Thermally Stable and Reflective RhZn—Ag Ohmic Contacts to p-type GaN for Near-UV Flip-chip Light-emitting Diodes," Journal of the Korean Physical Society 59, Jul. 2011, pp. 156-160, vol. 59, No. 1.
Rideout, V., "A review of the theory and technology for ohmic contacts to group III-V compound semiconductors," Solid-State Electronics, Jun. 1975, pp. 541-550, vol. 18, Pergamon Press.
Sohn et al., "Formation of Nonalloyed Low Resistance Ni—Au Ohmic Contacts to p-Type GaN Using Au Nanodots," Electrochemical and Solid-State Letters 7, 2004, pp. G179-181, No. 9, The Electrochemical Society, Inc.
Song et al., "Domain Matching Epitaxy of Mg-Containing Ag Contact on p-Type GaN," Crystal Growth & Design 11, 2011, pp. 2559-2563, No. 6, American Chemical Society.
Song et al., "Effects of Mg Additive on Inhibition of Ag Agglomeration in Ag-Based Ohmic Contacts on p-GaN," Electrochemical and Solid-State Letters 13, Mar. 2010, pp. H173-H175, No. 6, The Electrochemical Society.
Song et al., "Effect of Pt and Ti on Ni—Ag—(Pt or Ti)—Au p-ohmic contacts of GaN based flip-chip LEDs," Applied Surface Science 257, 2011, pp. 8102-8105, No. 18, Elsevier B.V.
Song et al., "Highly low resistance and transparent Ni—ZnO ohmic contacts to p-type GaN," Applied Physics Letters, Jul. 2003, pp. 479-481, vol. 83, No. 3, American Institute of Physics.
Song et al., "High-quality nonalloyed rhodium-based ohmic contacts to p-type GaN," Applied Physics Letters, Sep. 2003, pp. 2372-2374, vol. 83, No. 12, American Institute of Physics.
Song et al., "Highly transparent Ag—SnO2 ohmic contact to p-type GaN for ultraviolet light-emitting diodes," Applied Physics Letters, Dec. 2004, pp. 6374-6376, vol. 85, No. 26, American Institute of Physics.
Song et al., "Improvement of the electrical performance of near UV GaN-based light-emitting diodes using Ni nanodots," Solid-State Electronics 49, 2005, pp. 1986-1989, No. 12, Elsevier Ltd.
Song et al., "Low Resistance and Reflective Mg-Doped Indium Oxide-Ag Ohmic Contacts for Flip-Chip Light-Emitting Diodes," IEEE Photonics Technology Letters, Jun. 2004, pp. 1450-1452, vol. 16, No. 6, IEEE.
Song et al., "Ohmic-Contact Technology for GaN-Based Light-Emitting Diodes: Role of P-Type Contact," IEEE Transactions on Electron Devices, Jan. 2010, pp. 42-59, vol. 57, No. 1, IEEE.
Sun et al., "p-GaN surface treatments for metal contacts," Applied Physics Letters Jan. 2000, pp. 415-417, vol. 76, No. 4, American Institute of Physics.
Tamura et al., "InGaN-based light-emitting diodes fabricated with transparent Ga-doped ZnO as ohmic p-contact," phys. stat. sol. (a) 201, Sep. 2004 pp. 2704-2707, No. 12, Wiley-VCH Verlag GmbH & Co. KGaA, Weinheim.
Wang et al., "Improved light output of GaN-based vertical light emitting diodes using SiO2 nanotube arrays and transparent metal oxide current conduction layer," Applied Physics Letters 99, 2011, 131111-1-131111-3, American Institute of Physics.
Yamada et al., "InGaN-Based Near-Ultraviolet and Blue-Light-Emitting Diodes with High External Quantum Efficiency Using a Patterned Sapphire Substrate and a Mesh Electrode," Japanese Journal of Applied Physics, Dec. 2002, pp. L1431-L1433, vol. 41, No. 12B, Part 2, The Japan Society of Applied Physics.
Heising, S., Application No. EP 12858068, "Supplementary European Search Report," dated Jun. 29, 2015, 9 pages.
Nguyen, T., U.S. Appl. No. 13/711,675, Notice of Allowance, dated Jul. 8, 2015, 7 pages.
Nguyen, T., U.S. Appl. No. 13/711,675, Final Office Action, dated Feb. 18, 2015, 18 pages.
Ngyuen, T., U.S. Appl. No. 13/711,675, Non-Final Office Action, dated Oct. 23, 2014, 16 pages.
Park, International Search Report and Written Opinion for International Application No. PCT/US2012/069056, dated Mar. 28, 2013, 14 pages.
Zhou, L. et al., "Low resistance Ti—Pt—Au ohmic contacts to p-type GaN," Applied Physics Letters, Jun. 2000, pp. 3451-3453, vol. 76, No. 23, American Institute of Physics.
Japanese Application No. JP 2014-547358, Notice of Allowance (English translation not available), dated May 30, 2017, 3 pages.
Application No. EP 12858068, "Office Action1," dated Jun. 27, 2017, 8 pages.

* cited by examiner

ULTRAVIOLET REFLECTIVE CONTACT

REFERENCE TO RELATED APPLICATIONS

The present patent application is a continuation-in-part application of U.S. application Ser. No. 13/711,675, titled "Ultraviolet Reflective Contact," which was filed on 12 Dec. 2012, which claims the benefit of U.S. Provisional Application No. 61/569,416, titled "Ultraviolet Reflective Contact," which was filed on 12 Dec. 2011, each of which is hereby incorporated by reference in its entirety.

GOVERNMENT LICENSE RIGHTS

This invention was made with government support under contract no. W911NF-10-2-0023 awarded by the Defense Advanced Research Projects Agency (DARPA). The government has certain rights in the invention.

TECHNICAL FIELD

The disclosure relates generally to contacts for semiconductor devices, and more particularly, to an ultraviolet reflective contact.

BACKGROUND ART

Group III nitride-based semiconductors are widely used for efficient blue and ultraviolet light emitting diodes, lasers, ultraviolet detectors, and field effect transistors. Due to a wide band-gap, group III nitride semiconductor materials are one of the prime choices for deep ultraviolet light emitting diodes (DUV LEDs). While significant improvements in efficiency have been made for DUV LEDs in recent years, the overall efficiencies of these devices remains low. For example, the wide band-gap of the group III nitride semiconductor materials makes it difficult to form a good ohmic contact to the semiconductor layers, which leads to resistive losses at the contact junction.

DUV LED devices frequently employ flip-chip technology to control light extraction and thermal management of the DUV LED devices. For example, FIG. 1 shows a typical design of a flip-chip LED 2 according to the prior art. In this design, most of the light generated in the active region 4 is extracted through a transparent substrate. Efficiency of the flip-chip LED 2 is heavily dependent on the transparent properties of the semiconductor layers. However, for the flip-chip LED 2 to have a high efficiency, it also is desirable for each of the p-type contact 6 and the n-type contact 8 to be both ohmic and reflective, thereby allowing each contact 6, 8 to serve as an electrode as well as a mirror for reflecting light emitted by the active region 4. Additionally, the contacts 6, 8 should have stability during thermal cycling while packaging, as well as during operation of the device. Aluminum is a good reflecting metal, however, it does not produce an ohmic contact and is unstable during packaging.

Several types of metallic contacts have been proposed to improve ohmic contact to semiconductor layers. These contacts are formed of, for example: nickel/gold (Ni/Au), cobalt/gold (Co/Au), palladium/gold (Pd/Au), rhodium (Rh)-based, palladium/platinum/gold (Pd/Pt/Au), Pt/Ni/Au, Ni/Pt/Au, Ni/Pd/Au, and titanium/platinum/gold (Ti/Pt/Au) metallic layers. The thermal stability of Pd/Ni contacts is enhanced due to the formation of Pd gallides. Additionally, Pd/Ni contacts can lead to a reduction of contact resistivity. For Ni-based contacts, the Ni is easily oxidized above 400 degrees Celsius and the ohmic contact becomes worse at temperatures above 500 degrees Celsius.

One approach proposed a Pd/Ni/Al/Ti/Au metallization scheme for a contact, with the layers having corresponding thicknesses of 3 nanometers (nm)/2 nm/150 nm/20 nm/30 nm. The contact exhibited good thermal stability, reflectivity of sixty-two percent for radiation having a wavelength of 370 nm at normal incidence, and good ohmic characteristics after annealing at three hundred degrees Celsius in nitrogen gas ($N_2$). It is further noted that the combination of Pd and Ni results in a good ohmic contact, while a contact without Ni results in a larger resistance and non-linear behavior. Another approach removes residual oxide from a gallium nitride (GaN) surface using Ni deposition to achieve better ohmic contact properties.

To date, most contact engineering has been for visible LEDs or near ultraviolet (UV) LEDs. For example, one approach found good ohmic properties for an iridium/silver (Ir/Ag) p-type contact with a seventy-five percent reflectivity for radiation having a wavelength of 405 nm. For the same radiation wavelength, an indium-doped zinc oxide/silver (ZnO/Ag) contact had a reflectivity of 82.3%. These are only illustrative of many contact schemes proposed for radiation in the near UV wavelength. Indium tin oxide (ITO) and ZnO contact also have been proposed for LEDs operated at near UV or UVA wavelengths. However, for UV LEDs different contacts are required in order to provide highly reflective UV mirrors.

To lower resistance of a Schottky barrier, a difference between the work function of the metal and the semiconductor can be reduced. Unfortunately, for group III nitride semiconductors, the band gap is large and the resulting work function for the p-type semiconductors is large as well. It is understood that not only the work function of an aluminum gallium nitride (AlGaN) and metallic contact determines the behavior of the Schottky junction for a p-type semiconductor. The presence of high density surface states for covalent semiconductors pins the Fermi level at the interface. Regardless, it has been observed that the ohmic contact is sensitive to the metal work function. For example, aluminum, with a low work function of approximately four electron volts (eV) does not result in an ohmic contact. However, Pd and Ni, each with a work function above five eV form better ohmic contacts to semiconductor materials.

An approach describes a reflective electrode for a semiconductor light emitting device as including an ohmic contact layer formed of Ag or an Ag-alloy, which forms an ohmic contact with a p-type compound semiconductor layer. The Ag-alloy can be an alloy of Ag and a group of materials, such as magnesium (Mg), Zn, scandium (Sc), hafnium (Hf), zirconium (Zr), tellurium (Te), selenium (Se), tantalum (Ta), tungsten (W), niobium (Nb), copper (Cu), silicon (Si), Ni, Co, molybdenum (Mo), chromium (Cr), manganese (Mn), mercury (Hg), and praseodymium (Pr). The contact can include a layer composed of Ni or an Ni-alloy, which can have a thickness in the range between 0.1 and 500 nm. The contact also includes a layer located on the ohmic contact layer or the Ni layer, which is formed of a material selected from: Ni, Ni-alloy, Zn, Zn-alloy, Cu, Cu-alloy, ruthenium (Ru), Ir, and Rh, and a subsequent layer formed of a light reflective material. The reflective material can be Ag, Ag-alloy, Al, Al-alloy, or Rh, and have a thickness between 10 to 5000 nm. The electrode can further include another layer on the light reflective material to prevent an agglomeration phenomenon during the annealing process, which can occur on the surface of the reflective material without the additional layer being present. The layer can be formed of a material selected from: Cu, Cu/Ru, Cu/Ir, Cu-alloy, Cu-alloy/Ru and Cu-alloy/Ir.

SUMMARY OF THE INVENTION

The inventors have found that the above-described contacts, while they may be optimal for near UV and UVA LEDs, the contact to a p-type group III semiconductor for a DUV LED can be improved in order to achieve a higher efficiency in the UV emission range.

Aspects of the invention provide a contact including an ohmic layer and a reflective layer located on the ohmic layer. The ohmic layer is transparent to radiation having a target wavelength, while the reflective layer is at least approximately eighty percent reflective of radiation having the target wavelength. The target wavelength can be ultraviolet light, e.g., having a wavelength within a range of wavelengths between approximately 260 and approximately 360 nanometers.

A first aspect of the invention provides a contact comprising: a graded ohmic layer having a delta composition profile formed of at least two annealed metals, wherein the ohmic layer is transparent to radiation having a target wavelength; and a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

A second aspect of the invention provides a device comprising: a first semiconductor layer; a contact to the first semiconductor layer, wherein the contact includes: an ohmic layer, wherein the ohmic layer is transparent to radiation having a target wavelength; and a reflective layer located on the ohmic layer, wherein the reflective layer is at least approximately eighty percent reflective of radiation having the target wavelength, and wherein the target wavelength is within a range of wavelengths between approximately 260 and approximately 360 nanometers; and a second semiconductor layer located between the first semiconductor layer and the contact, wherein the second semiconductor layer has a band gap narrower than a band gap of the first semiconductor layer, and wherein the second semiconductor layer has a thickness less than approximately fifty nanometers.

A third aspect of the invention provides a device comprising: a first group III nitride semiconductor layer; a patterned second group III nitride semiconductor layer located on the first semiconductor layer, wherein the second semiconductor layer has a band gap narrower than a band gap of the first semiconductor layer, and wherein the second semiconductor layer has a thickness less than approximately fifty nanometers; and a contact located on the second semiconductor layer, wherein the contact includes: an ohmic layer, wherein the ohmic layer is transparent to radiation having a target wavelength; and a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a contact including an ohmic layer and a reflective layer located on the ohmic layer. The ohmic layer is transparent to radiation having a target wavelength, while the reflective layer is at least approximately eighty percent reflective of radiation having the target wavelength. The target wavelength can be ultraviolet light, e.g., having a wavelength within a range of wavelengths between approximately 260 and approximately 360 nanometers. As used herein, unless otherwise noted, the term "set" means one or more (i.e., at least one) and the phrase "any solution" means any now known or later developed solution.

Figure 1:
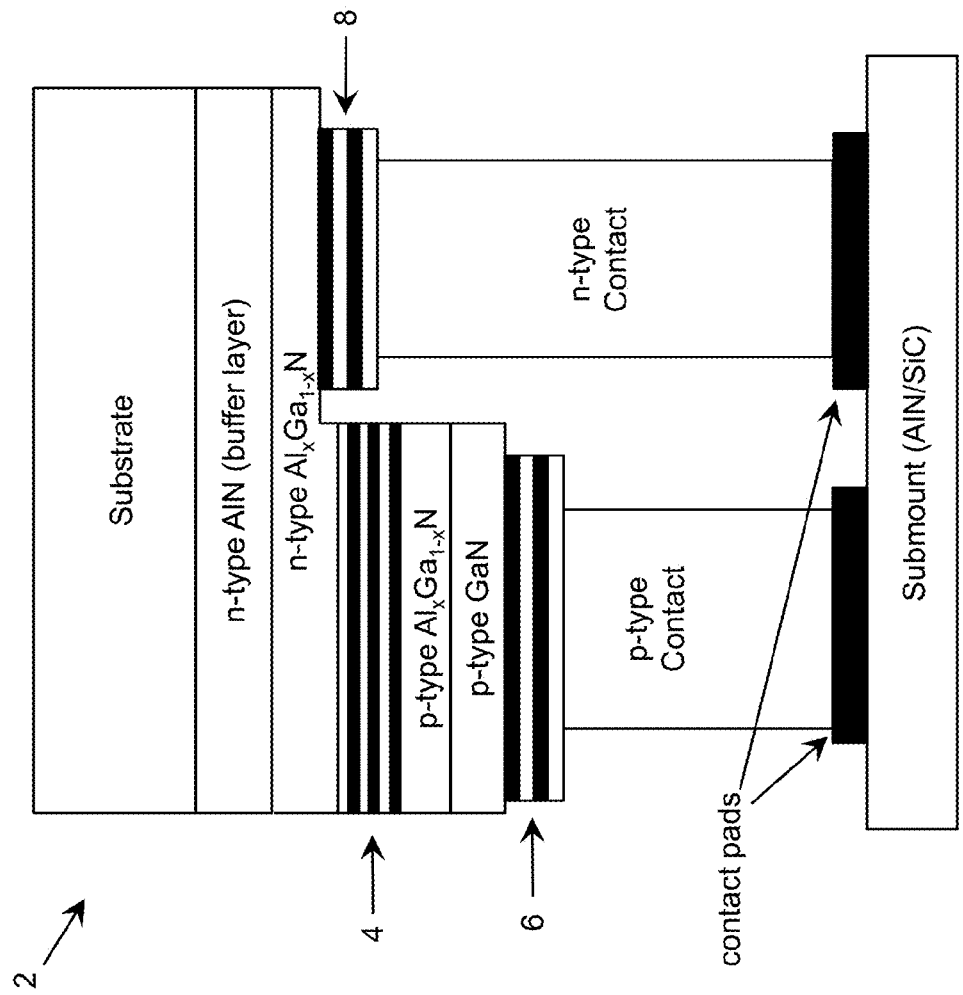
FIG. 1 shows a typical design of a flip-chip LED according to the prior art.

Furthermore, it is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact. In an embodiment, the largest resistive element is an active region of the corresponding device (e.g., a resistance of the active region 4 of the LED shown in FIG. 1). As used herein, a layer/material is considered "transparent" if it allows at least approximately ten percent of electromagnetic radiation in a corresponding range of radiation wavelengths to pass there through. Similarly, a layer/material is considered "reflective" if it reflects at least approximately ten percent of electromagnetic radiation in a corresponding range of radiation wavelengths.

Figure 2:
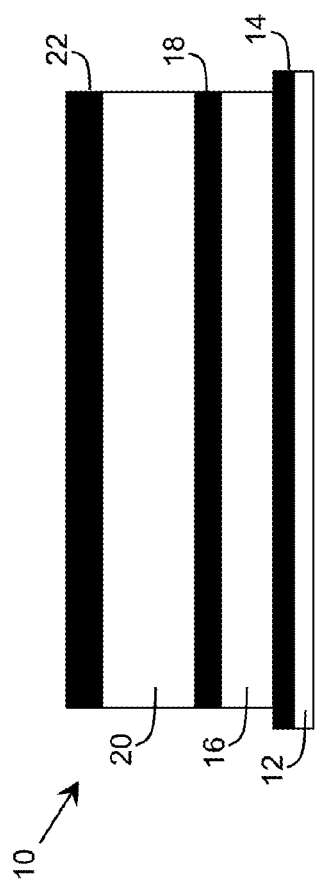
FIG. 2 shows an illustrative multi-layer contact according to an embodiment.

Turning to the drawings, FIG. 2 shows an illustrative multi-layer contact 10 according to an embodiment. The contact 10 can be implemented as a p-type or n-type contact for a semiconductor device. In an embodiment, the contact 10 is implemented on a light emitting device, such as a conventional or super luminescent light emitting diode (LED). Alternatively, the emitting device can be configured to operate as a laser diode (LD). For example, the contact 10 can be formed on a flip-chip LED, which is configured similar to the LED 2 (FIG. 1), e.g., in place of one or both of the contacts 6, 8 shown thereon. However, it is understood that a flip-chip LED is only illustrative of various types of semiconductor devices for which one or more of the contacts 10 can be utilized.

While aspects of the invention are generally shown and described herein with respect to improving extraction of light from an emitting device, it is understood that aspects of the invention further provide various alternative embodiments. For example, aspects of the invention can be implemented to facilitate the transmission of light within the device, e.g., as part of optical pumping of a laser light generating structure, excitation of a carrier gas using a laser pulse, and/or the like. Similarly, an embodiment of the invention can be implemented in conjunction with a sensing device, such as a photosensor or a photodetector. In each case, a contact described herein can be included in order to facilitate the reflection of light in a desired direction.

The electromagnetic radiation emitted or sensed by a device including a contact described herein can comprise a peak wavelength within any range of wavelengths, including visible light, ultraviolet radiation, infrared light, and/or the like. In an embodiment, the device is configured to generate and/or sense radiation having a peak wavelength in the ultraviolet spectrum (e.g., an ultraviolet device). In a more particular embodiment, the ultraviolet device is configured to emit and/or detect radiation having a peak wavelength in the deep ultraviolet radiation spectrum.

In an embodiment, the emitting or sensing device is a group III-V materials based device, in which some or all of the various layers are formed of elements selected from the group III-V materials system. In a more particular illustrative embodiment, the various layers of the device are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

In any event, the contact 10 can include an ohmic layer 12, which is located on a surface of a semiconductor layer of a device heterostructure. The ohmic layer 12 can be formed of any type of material, which makes a good ohmic contact to the semiconductor layer on which the contact 10 is located. Furthermore, when implemented on an ultraviolet device, the ohmic layer 12 can be transparent (transmissive) to ultraviolet radiation having a target wavelength. For example, the ohmic layer 12 can be approximately eighty percent or more ultraviolet transmitting. In an embodiment, the ohmic layer 12 is formed of two or more metal sub-layers, which can have an abrupt interface during deposition. In an embodiment, the sub-layers of the ohmic layer 12 are partially alloyed. One or more of the metals can be, for example: cobalt (Co), nickel (Ni), palladium (Pd), iron (Fe), and platinum (Pt). Additionally, one or more of the metals can be: Pd, rhodium (Rh), ruthenium (Ru), osmium (Os), iridium (Ir), thorium (Th), and boron (B), which can incorporate one or more of: calcium (Ca), magnesium (Mg), beryllium (Be), manganese (Mn), or tin (Sn), with a maximum concentration up to approximately $10^{21}$ cm$^{-3}$. For example, the ohmic layer 12 can include: a sub-layer of Co/Mg/Ni having a thickness of approximately one to two nanometers, which can act as an adhesive; a two to five nanometer sub-layer of palladium, which can provide a good ohmic contact; and a sub-layer of rhodium having a thickness of approximately 150 Angstroms.

Figure 3B:
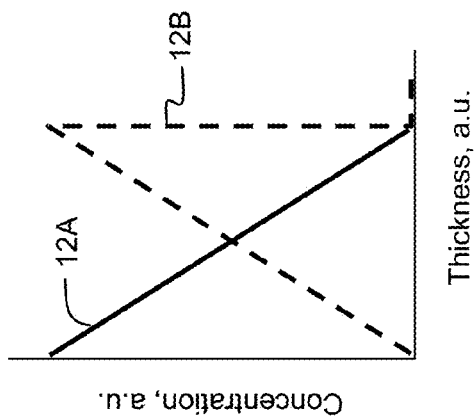
FIGS. 3A and 3B show schematics of a concentration of two metals before and after annealing, respectively, according to an embodiment.
Figure 3A:
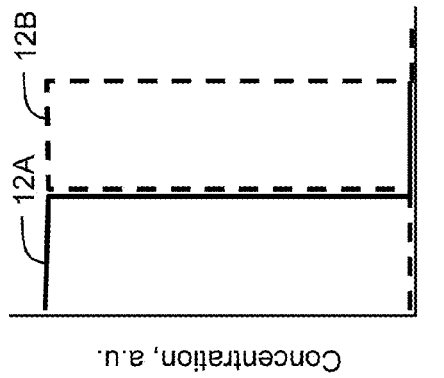

In an embodiment, the ohmic layer 12 can be annealed after formation (e.g., deposition) of the two or more metal layers. The annealing can form a graded ohmic layer 12 having a delta composition profile. To this extent, FIGS. 3A and 3B show schematics of a concentration of a first metal 12A and a second metal 12B forming an ohmic layer 12 (FIG. 2) before and after annealing, respectively, according to an embodiment. As illustrated in FIG. 3A, after the formation of the metal layers and prior to annealing, a sharp interface is present between the two metals 12A, 12B. However, after annealing as shown in FIG. 3B, the relative concentration between the two metals 12A, 12B in the ohmic layer 12 forms a delta concentration profile. Similarly, the delta composition profile can be formed by co-deposition of the metals or deposition of graded thin layers, e.g., using thermal evaporation, e-beam deposition, magnetron sputtering, evaporation by laser beam, and/or the like. The formation also can include annealing in nitrogen, argon, oxygen, or the like, containing ambient at a temperature of 450-800 degrees Celsius.

Returning to FIG. 2, the contact 10 also is shown including an ohmic protective layer 14, which is located directly on the ohmic layer 12. The ohmic protective layer 14 can comprise any type of material and have a minimum thickness to prevent diffusion of a subsequent layer, such as a reflective layer 16 into the ohmic layer 12. In an embodiment, the ohmic protective layer 14 is a metallic layer having a thickness on the order of a few tens of nanometers. Furthermore, the ohmic protective layer 14 can have a high reflectivity of ultraviolet radiation having a target wavelength. In an embodiment, the ohmic protective layer 14 has a reflectivity of at least approximately sixty percent of ultraviolet radiation having the target wavelength. In a more particular embodiment, the ohmic protective layer is formed of rhodium. However, it is understood that this is only illustrative. To this extent, the ohmic protective layer 14 can be formed of: a metal such as: Pt, rhenium (Re), Pd, Rh, Ru, Os, Ir, or the like; an oxide, such as indium tin oxide (ITO), zinc oxide (ZnO), or the like; and/or the like.

In an embodiment, the ohmic protective layer 14 is sufficiently thin such that at least a portion of the ultraviolet radiation is transmitted there through. As a result, the ohmic protective layer 14 can be semi-transparent and semi-reflective of ultraviolet radiation having a target wavelength. To this extent, the contact 10 can include a reflective layer 16 located directly on the ohmic protective layer 14. The reflective layer 16 can be formed of any type of material that is reflective of radiation, such as ultraviolet radiation, having a target wavelength, and have a sufficient thickness to reflect a minimum target amount of the radiation. In an embodiment, the reflective layer 16 is formed of a material that is at least approximately eighty percent reflective of ultraviolet radiation having a target wavelength. In a more particular embodiment, the ohmic protective layer is formed of aluminum (Al). However, it is understood that this is only illustrative. To this extent, the reflective layer 16 can be formed of: Mg, Al, Be, B, scandium (Sc), Rh, Ir, Os, Pt, Pd, Re, or their alloys, such as an Al/Be alloy, an Al/Mg alloy, and/or the like.

Additionally, the contact 10 can include a reflector protective layer 18, which is located directly on the reflective layer 16. The reflector protective layer 18 can comprise any type of material and have a minimum thickness to prevent intermixing between the reflective layer 16 and a subsequent layer, such as a conductive layer 20. The reflector protective layer 18 can be formed of any suitable material, such as: titanium (Ti), zirconium (Zr), hafnium (Hf), molybdenum (Mo), tungsten (W), Pd, Rh, Ru, Os, Ir, vanadium (V), chromium (Cr), Pt, or their alloys.

The conductive layer 20 can be located directly on the reflector protective layer 18, and can comprise a layer of any type of material having a high electrical conductivity (e.g., a conductivity of at least $10^6$ Siemens per meter (S/m) at operational temperatures of the corresponding device). Additionally, the conductive layer 20 can have a high thermal conductivity. For example, the conductive layer 20 can be a thick metal layer having a low hardness. Illustrative metals for the conductive layer 20 include: copper (Cu), silver (Ag), gold (Au), nickel (Ni), or their alloys. In an embodiment, the conductive layer 20 comprises gold.

The contact 10 also can include a dielectric adhesion layer 22 located directly on the conductive layer 20. The dielectric adhesion layer 22 can comprise a layer of any type of material, which can promote adhesion of an insulating dielectric film (e.g., silicon dioxide) to the contact 10. The insulating dielectric film can be deposited, for example, on one or more regions of a contact pad area (e.g., when the contact 10 is implemented as part of a flip-chip device. In an embodiment, the dielectric adhesion layer 22 is a thin (e.g., approximately 300 angstroms) layer of a metal, such as Ti, Ni, Zr, Pd, and/or the like. In an embodiment, the dielectric adhesion layer 22 has a thickness of at least approximately one hundred angstroms. The insulating dielectric film subsequently can be formed on a portion of a top surface of the dielectric adhesion layer 22 using any solution (e.g., deposition).

The various layers of the contact 10 can be formed using any solution. For example, a layer of the contact 10 can be formed using thermal evaporation, e-beam deposition, magnetron sputtering, evaporation by laser beam, and/or the like. In embodiment, a semiconductor structure is obtained (e.g., grown) and the location(s) for one or more contacts to be located on a surface of the structure is (are) identified. A photoresist can be placed on the surface and can include openings at the identified location(s). Subsequently, the ohmic layer 12, and the ohmic protective layer 14 can be formed in the openings using any solution (e.g., by growing the layers 12, 14 using e-beam deposition followed by subsequent removal of the photoresist using acetone or the like). The layers 12, 14 can undergo a rapid thermal annealing (e.g., heating the structure to 600 degrees Celsius and subsequently cooling the structure at rates of approximately eight degrees Celsius per second) while the structure is located within a chamber filled with an inert gas. Subsequently, the remaining layers, such as the reflective layer 16, the reflector protective layer 18, the conductive layer 20, and the dielectric adhesion layer 22 can be formed using any solution (e.g., using a photoresist and subsequent growth or the like).

Figure 4:
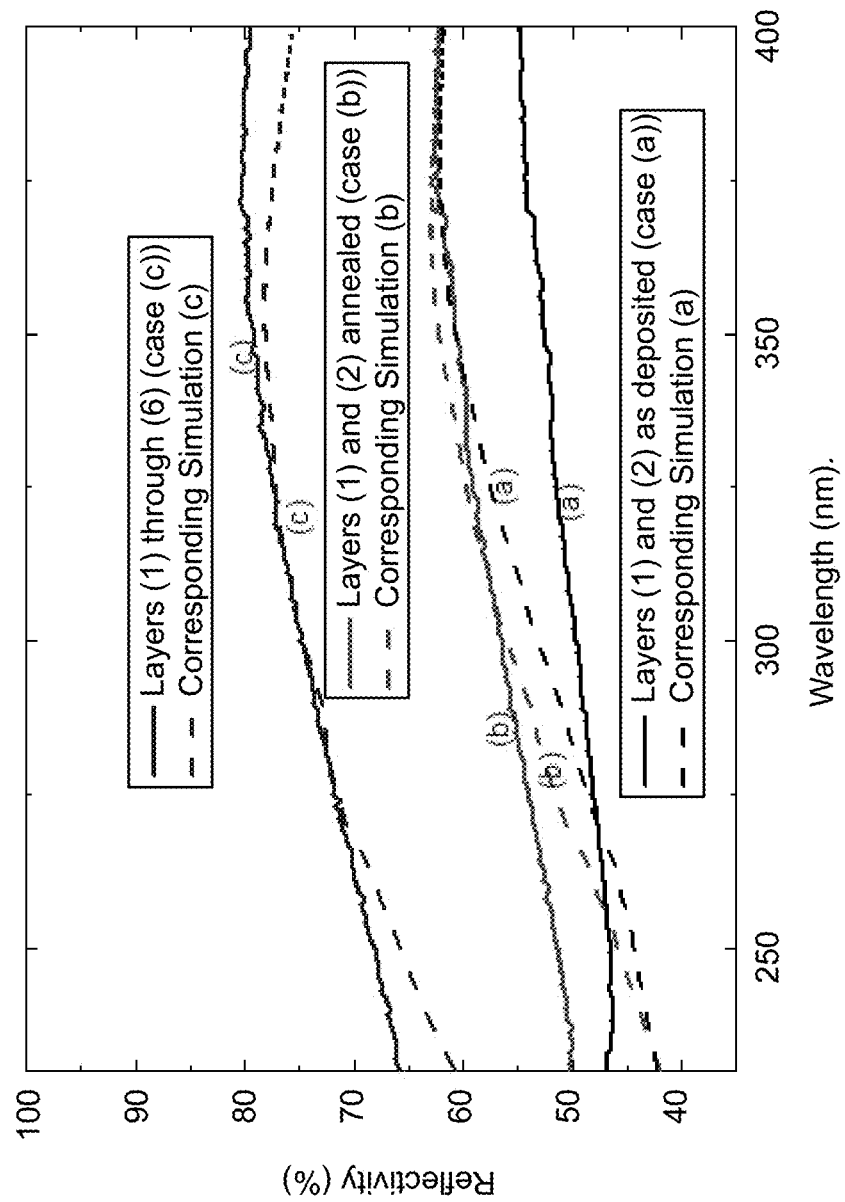
FIG. 4 shows simulated and measured reflective coefficients of illustrative contact configurations according to an embodiment.

As discussed herein, the contact 10 can be configured to be reflective of radiation having a target wavelength. To this extent, illustrative contact configurations described herein were simulated and measured for their reflectivity. FIG. 4 shows simulated and measured reflective coefficients of illustrative contact configurations according to an embodiment. In a first configuration (case (a)), a reflectivity for a contact including an ohmic layer 12 and an ohmic protective layer 14 was simulated and measured over a range of radiation wavelengths between approximately 240 nanometers and 400 nanometers. In a second configuration (case (b)), a reflectivity for a contact including an ohmic layer 12 and an ohmic protective layer 14, which have been annealed, was simulated and measured over the same range of radiation wavelengths. Finally, in a third configuration (case (c)), a reflectivity for a contact including all six layers shown in FIG. 2 (with layers 12 and 14 annealed), was simulated and measured over the same range of radiation wavelengths.

As illustrated, each contact configuration (cases a-c), has a reflectivity (e.g., as measured for a vacuum-to-contact interface) of at least approximately forty-five percent for radiation having a wavelength in the ultraviolet spectral range between approximately 260 and approximately 360 nanometers. Furthermore, annealing the layers 12 and 14 as described herein provided a noticeable improvement in the reflectivity, while the addition of the reflective layer 16 (and the subsequent layers) significantly increased an overall reflectivity of the contact. For radiation having a wavelength in the ultraviolet spectral range between approximately 260 and approximately 360 nanometers, the reflectivity of the case (c) contact configuration was between approximately seventy percent and approximately eighty percent.

Considering a particular embodiment of the contact 10 with respect to radiation having a target wavelength (e.g., ultraviolet radiation): the ohmic layer 12 is formed of nickel/cobalt/palladium, has a total thickness of less than one hundred angstroms, and a transmission of at least sixty percent; the ohmic protective layer 14 is formed of rhodium, has a thickness in a range between twenty and five hundred angstroms, and a reflectivity of at least forty percent; the reflective layer 16 is formed of aluminum, has a reflectivity of at least eighty percent, and a thickness of at least two hundred nanometers; the reflector protective layer 18 has a thickness of at least three hundred angstroms; the conductive layer 20 is a highly thermally and electrically conductive low hardness layer with a thickness of at least five hundred angstroms; and the dielectric adhesion layer 22 has a thickness of at least one hundred angstroms. In each case, the reflectivity is measured at a vacuum to material interface.

Figure 5:
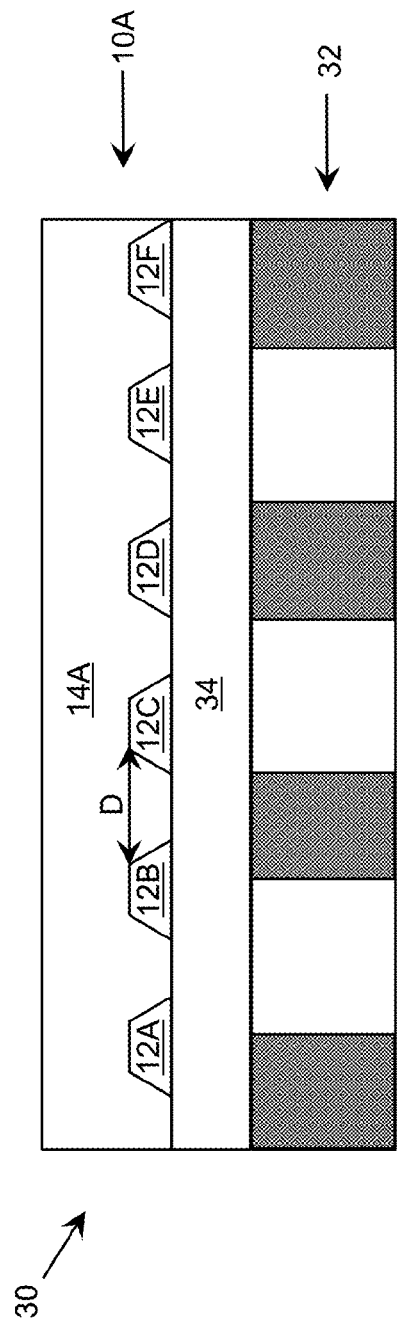
FIG. 5 shows a portion of an illustrative device structure according to an embodiment.

Prior to formation of the contact, the semiconductor structure can be processed to improve one or more aspects of the contact. To this extent, FIG. 5 shows a portion of an illustrative device structure 30 according to an embodiment. The device structure 30 includes a contact 10A to a semiconductor layer 32. In an embodiment, a thin layer of a material 34 is deposited on the semiconductor layer 32 prior to formation of the contact 10A. The layer 34 can have a band gap that is narrower than a band gap of the layer 32. The layers 32, 34 can be formed of any suitable material based on one or more target attributes of the device corresponding to the device structure 30. In an embodiment, the layers 32, 34 are group III-V semiconductor layers, such as group III nitride layers. In a more particular embodiment, the layer 32 is formed of AlGaN, and the layer 34 is formed of GaN. The layer 34 can have a thickness less than approximately fifty nanometers, e.g., on the order of a few nanometers or less. Furthermore, the layer 34 can be doped. The doping can be p-type or n-type. In an embodiment, the layer 34 is polarization doped, which can allow for better ohmic contact with the semiconductor layer 32. For example, the layer 34 can comprise a thin layer of highly doped GaN, which is either n-type or p-type and has a gallium content of more than eighty percent. Alternatively, the layer 34 can be formed of $In_xAl_yGa_{1-x-y}N$, where $0 \leq x$, $y \leq 1$, and $x+y \leq 1$. Additionally, the layer 32 can comprise a graded GaN—AlGaN region.

In an embodiment, one or more of the layers of a contact and/or a device described herein can have a laterally inhomogeneous structure. To this extent, the layer 32 can be laterally inhomogeneous, e.g., which can provide inhomogeneous conductive and/or transparent properties for the layer 34 in the lateral direction. Additionally, the contact 10A is shown including a laterally inhomogeneous ohmic layer. In particular, the ohmic layer is formed of a plurality of ohmic islands 12A-12F. The ohmic islands 12A-12F can be randomly located or patterned. An alignment of the ohmic islands 12A-12F above the inhomogeneous regions of the semiconductor layer 32 can be either random or predetermined through, for example, semiconductor layer patterning and overgrowth, ohmic layer patterning, and/or the like.

In an embodiment, an ohmic layer material is deposited and subsequently annealed with an ohmic protective layer 14A, which forms randomly positioned islands 12A-12F embedded into the ohmic protective layer 14A. Alternatively, the ohmic layer material can be annealed prior to the deposition of the ohmic protective layer 14A. In this case, the ohmic islands 12A-12F can act as nucleation sites for the deposition of the ohmic protective layer 14A (or another ohmic layer). The ohmic islands 12A-12F can have ohmic contact properties with the underlying semiconductor layer 34 and transparent properties, one or both of which can differ from the conductive and transparent properties at the intermittent regions between the ohmic islands 12A-12F.

Alternatively, the ohmic islands 12A-12F can be patterned. For example, the ohmic islands 12A-12F can form a photonic crystal. Similarly, the underlying semiconductor layer 34 can be patterned. In an embodiment, a characteristic size of the pattern is at the nano-scale. The patterning of the ohmic islands 12A-12F and/or the semiconductor layer 34 can provide control over a size, position, relative distance between the ohmic islands 12A-12F, and/or the like. The ohmic islands 12A-12F and/or semiconductor layer 34 can be patterned using any solution, such as etching, masking, and/or the like. In an embodiment, the ohmic layer partially penetrates the semiconductor layer 34, e.g., by heating the semiconductor layer 34 during the deposition of the ohmic layer.

In an embodiment, one or more aspects of the ohmic layer can be configured based on a target set of electrical properties for the interface between the layer 34 and the contact 10A. For example, when the ohmic islands 12A-12F are formed during annealing, a thickness of the ohmic layer material that is deposited prior to annealing can be selected such that after annealing, an average distance between the ohmic islands 12A-12F is less than or comparable to a current spreading length in the underlying semiconductor layer 34, while the ohmic islands 12A-12F cover a sufficient area of the semiconductor layer 34 to provide a reliable and operationally stable ohmic contact 10A. Furthermore, a characteristic area of the ohmic islands 12A-12F and a characteristic separation D between the ohmic islands 12A-12F can be such that a contact resistance of the contact 10A per unit area divided by the characteristic area of the ohmic islands 12A-12F differs by less than a factor of ten from a sheet resistance of the semiconductor layer 34 multiplied by a characteristic separation D between adjacent ohmic islands 12A-12F and divided by the characteristic width of the ohmic islands 12A-12F.

Figure 6:
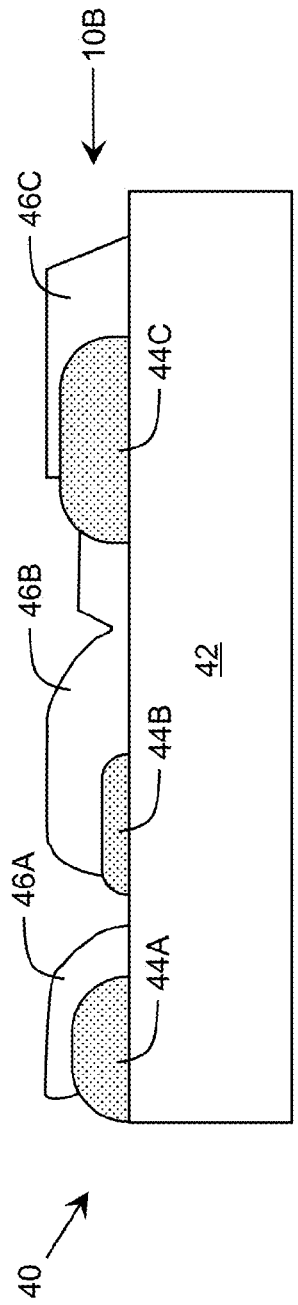
FIG. 6 shows a portion of an illustrative device structure according to another embodiment.

In another embodiment, another ohmic metallic layer, e.g., a layer of palladium, is annealed with the ohmic layer instead of the ohmic protective layer 14A. Alternatively, a contact can include ohmic islands intermitted by another metallic layer, which forms a Schottky contact with the underlying semiconductor layer. To this extent, FIG. 6 shows a portion of an illustrative device structure 40 according to another embodiment. The device structure 40 includes a semiconductor layer 42, such as a group III nitride semiconductor layer, on which is located a contact 10B. The contact 10B includes a set of ohmic islands 44A-44C intermitted by another set of islands 46A-46C, which may or may not be continuous. In an embodiment, both sets of islands 44A-44C, 46A-46C are formed of different types of metals, e.g., cobalt and nickel. In a further embodiment, the set of islands 46A-46C can comprise a metal with a low work function, such as titanium, and form a Schottky contact with the semiconductor layer 42.

As discussed herein, the reflective properties of the ohmic islands, such as the ohmic islands 12A-12F of FIG. 5 or the ohmic islands 44A-44C of FIG. 6, can differ from the reflective properties of the interspersed layer of material, such as the ohmic protective layer 14A or the set of islands 46A-46C. In an embodiment, the interspersed layer of material can be highly reflective of radiation having a target wavelength (e.g., ultraviolet radiation), while the ohmic islands are substantially transmissive or absorbing of radiation having the target wavelength. For example, the interspersed layer of material can have a reflectivity higher than approximately sixty percent (as measured at a vacuum to layer interface) for ultraviolet radiation having a target wavelength. Regardless, the interspersed layer of material can partially overlap the ohmic layer, alloy with the ohmic layer, be directly above the ohmic layer, be between the islands of the ohmic layer, or any combination thereof.

Figure 7:
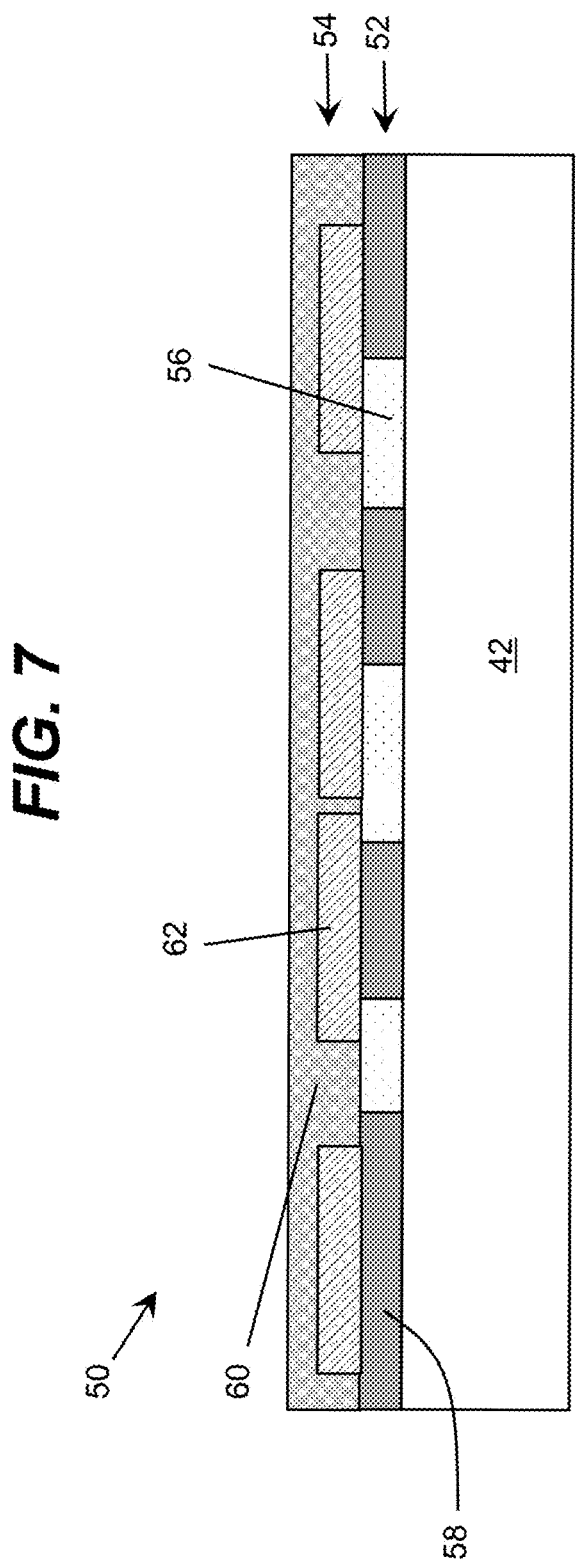
FIG. 7 shows a portion of an illustrative device structure according to still another embodiment.

FIG. 7 shows a portion of an illustrative device structure 50 according to another embodiment in which more than one contact layer is deposited over the semiconductor layer 42. As shown in FIG. 7, the device structure 50 includes a contact layer 52 deposited over the semiconductor layer 42 and a contact layer 54 deposited over the contact layer 52. Although the device structure 50 of FIG. 7 is illustrated with only two contact layers, it is understood that the device structure 50 can have more than two contact layers formed over the semiconductor layer 42.

The contact layer 52 can include a matrix material 56 with conductive metal islands 58 embedded into the matrix material 56. In one embodiment, the matrix material 56 can comprise an ultraviolet transparent dielectric. In a more particular embodiment, the ultraviolet transparent dielectric transmits at least 30% of ultraviolet light intensity for light directed normal to the surface of the transparent dielectric layer. Examples of an ultraviolet transparent dielectric can include, but are not limited to, sapphire, AAO, fused silica, $MgF_2$, $CaF_2$, $BaF_2$ and or the like. In one embodiment, the matrix material 56 can comprise a conductive metal including, but not limited to, Nickel, Rhodium, or Palladium. In one embodiment, the matrix material 56 can comprise a reflective metal including, but not limited to, Aluminum or Rhodium. In one embodiment, the matrix material 56 can comprise a diffusively reflective dielectric. As used herein, a diffusively reflective dielectric can mean that at least some light is scattered in a direction different from specular reflection. For example, a material exhibits diffusively reflective properties if at least 20% of scattered light is reflected in a direction that is at least ten degrees different from the specular direction of reflection. In one embodiment, the matrix material 56 can comprise a semiconductor material including, but not limited to, InGaN, AlGaN, GaN, ZnO, AlZnO, MgO, and BN. In one embodiment, the conductive metal islands 58 can include, but are not limited to, metals such as Nickel, Palladium, and combinations thereof.

The contact layer 54 can include a matrix material 60 with ultraviolet reflective elements 62 embedded in the matrix material 60. In one embodiment, the matrix material 60 can include a conductive metal. Examples of a conductive metal suitable for use as the matrix material 60 can include, but are not limited to Aluminum, Gold, Rhodium, and or the like. In one embodiment, the matrix material 60 can include a partially ultraviolet transparent metal. Examples of a partially ultraviolet transparent suitable for use as the matrix material 60 can include, but are not limited to sapphire, AAO, fused silica, $MgF_2$, $CaF_2$, $BaF_2$ and or the like. In one embodiment, the matrix material 60 can include a conductive oxide. Examples of a conductive oxide suitable for use as the matrix material 60 can include, but are not limited to ITO, or $Ga_2O_3$ with Magnesium doping. In one embodiment, the matrix material 60 can include a semiconductor material. Examples of a semiconductor material suitable for use as the matrix material 60 can include, but are not limited to InGaN, AlGaN, GaN, ZnO, AlZnO, MgO, and BN. In one embodiment, the matrix material 60 can include a partially ultraviolet transparent dielectric. Examples of a partially ultraviolet transparent dielectric suitable for use as the matrix material 60 can include, but are not limited to silicon oxide ($SiO_2$), aluminum oxide ($Al_2O_3$), aluminum nitride (AlN), and/or the like. In one embodiment, the matrix material 60 can include semiconductor nanodots, e.g., for the purpose of scattering light. Those skilled in the art will appreciate that the material for the matrix material 60 can be chosen to be inhomogeneous and comprise several materials. For instance the matrix material 60 can have semiconductor islands covered by a dielectric.

In embodiment, the ultraviolet reflective elements 62 embedded in the matrix material 60 can comprise an aluminum metallic film, a specularly or diffusively reflective polymer such as a polytetrafluoroethylene (PTFE) membrane (e.g., GORE® Diffuse Reflector Material), or a similar polymer. Alternatively, the ultraviolet reflective elements 62 can comprise a dielectric such as $SiO_2$ and $Al_2O_3$. In one embodiment, the ultraviolet reflective elements 62 can comprise a Bragg mirror having alternative layers of a high and a low refractive index dielectric such as alternative elements of $Al_2O_3$ and hafnium oxide ($Hf_2O_3$) or alternating elements of $SiO_2$ and $Hf_2O_3$, or similar dielectric partially transparent materials.

In one embodiment, these islands of reflective material, as defined by the contact layer 54 having the matrix material 60 with ultraviolet reflective elements 62 embedded therein, can form a photonic crystal. In this manner, this enables the device structure 50 to further control and manipulate the ultraviolet radiation emitted from the active region of the device. In an embodiment, the contact structure shown can be designed to provide optimal reflection of the ultraviolet radiation while maintaining reasonable levels of contact conductivity.

It is understood that the type of the contact material that is selected for the contact layers 52 and 54 can be selected based on the underlying semiconductor layer 42, and more specifically, the optical properties of the underlying semiconductor layer. In one embodiment, the optical reflectivity, and diffusive scattering of the contact layers 52 and 54 can be selected and enhanced for an ultraviolet transparent semiconductor layer 42. In an embodiment, an ultraviolet transparent semiconductor layer transmits at least 30% of ultraviolet light intensity for light directed normal to the surface of such layer. Examples of an ultraviolet transparent semiconductor layer can include, but are not limited to, AlN, AlGaN, ZnO, AlZnO, and BN. Alternatively, for a highly ultraviolet absorbing semiconductor layer 42, such as for example, InGaN, or GaN, the optical properties of the contact layers 52 and 54 are diminished and an emphasis in their selection can be made based on their conductive properties.

The device structure 50 of FIG. 7 can be formed in the following manner. The surface of the semiconductor layer, onto which the contact layer is to be deposited, can be cleaned and partially masked. The dielectric layer or reflective metallic layer can be deposited in the regions containing no masking material. Subsequently, the masking regions can be removed, and conductive material can be deposited in the domains previously covered by masking material. An alternative implementation can include deposition of a dielectric or a reflective layer over the entire lateral surface area of the semiconductor layer, with subsequent removal of such layer (through the photolithographic process), and deposition of conductive domains in the vacant areas. Alternatively, the conductive layer can be deposited first, and subsequently, partially removed through photolithography, followed by deposition of the dielectric or the reflective layer. The steps of depositing and removing portions of the layers can be repeated resulting in a structure 50. An alternative implementation can result through the deposition of a thin layer of conductive metal, followed by annealing, wherein annealing leads to formation of islands within the thin layer. A subsequent deposition of a reflective layer can result in a layer having both reflective and conductive domains. In an embodiment, the deposition of a reflective layer can be implemented first, following the deposition of the conductive layer.

Figure 8:
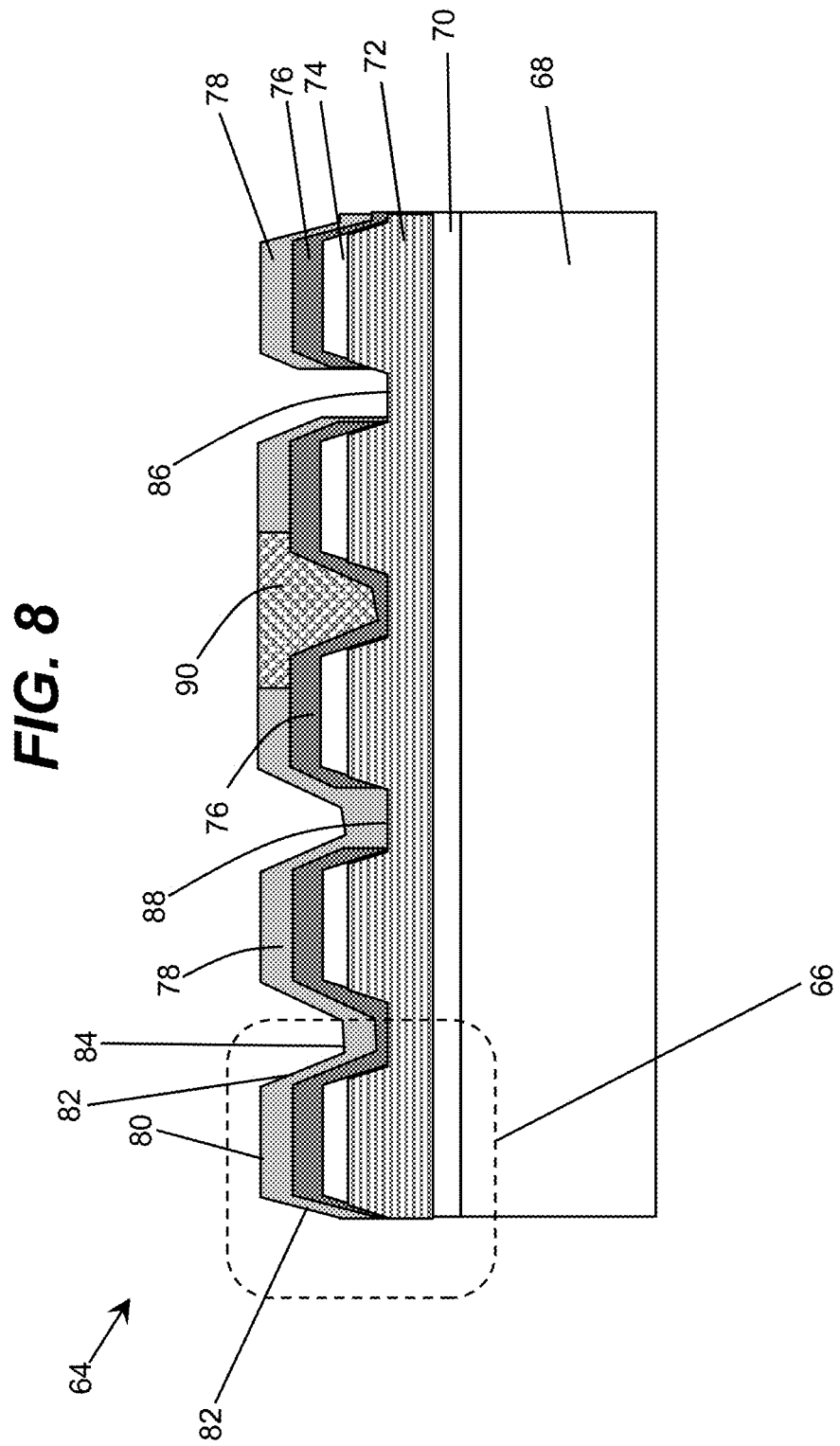
FIG. 8 shows a portion of an illustrative device structure with multiple mesa according to an embodiment.

FIG. 8 shows a portion of an illustrative device structure 64 according to an embodiment that is patterned with a set of multiple mesas 66. Note that for clarity, only one mesa 66 is delineated in FIG. 8 with dotted lines. As shown in FIG. 8, the device structure 64 can include a semiconductor layer 68, which can include, but is not limited to, an $Al_xGa_{1-x}N$ layer of varying composition. Alternatively, the top portion of the semiconductor layer 68 can comprise an AlInGaN layer with a band gap that is lower than the band gap of the adjacent semiconductor layer 70. In one embodiment, the semiconductor layer 68 can include a p-type semiconductor layer. Semiconductor layer 70 can comprise a p-type semiconductor layer with low acceptor activation energy to improve conductivity of the layer, wherein such layer can comprise GaN, or $Al_xIn_yGa_{1-x-y}N$ or $Al_xGa_{1-x}N$ with a lower molar fraction of Aluminum Nitride formed over the semiconductor layer 68. Another semiconductor layer 72 containing a semiconductor superlattice can be formed over the semiconductor layer 70. Such a layer 72 can be formed of, for example, a $Al_xGa_{1-x}N/Al_yGa_{1-y}N$ layer with x and y values selected to improve the electrical conductivity of a layer as shown for example in U.S. patent application Ser. No. 12/960,476, titled "Semiconductor Material Doping", filed on. 4 Dec. 2010 and hereby incorporated by reference.

Each mesa 66 formed over the semiconductor layer 68, the semiconductor layer 70, and the superlattice semiconductor layer 72 can include a semiconductor layer 74, an ohmic layer 76 formed over the semiconductor layer 74, and a reflective layer 78 formed over the ohmic layer 76. In one embodiment, the semiconductor layer 74 can include, but is not limited to, a low bandgap group III nitride semiconductor layer such as InN, or GaN. In one embodiment, the ohmic layer 76 can include, but is not limited to, Nickel, Palladium or Rhodium or a metallic contact having specific resistance similar to that of the Nickel based contact. In one embodiment, the reflective layer 78 can include, but is not limited to, Rhodium or Aluminum. The semiconductor layer 74, the ohmic layer 76 and the reflective layer 78 can be formed over the semiconductor layer 68, the semiconductor layer 70 and the superlattice semiconductor layer 72 using processing methodologies that can include an epitaxial growth method.

The mesa 66, as illustrated in FIG. 8, defines a top surface 80 and a pair of sidewalls 82 extending downward from the top surface 80. A valley or a moat 84 is formed between adjacent mesas 66. The valley 84 extends up the sidewalls 82 of each mesa 66 formed therebetween towards their top surface 80. In one embodiment, the set of mesas 66 can be formed in the semiconductor layer 74, the ohmic layer 76 and the reflective layer 78 through etching of the semiconductor regions followed by deposition of metallic layers through metal evaporation, sputtering, and/or the like. As shown in FIG. 8, the valley 84 formed between two adjacent mesas 66 can extend below a top surface of the superlattice semiconductor layer 72.

FIG. 8 shows that the valley 84 formed between the mesa 66 can have any of several different configurations. For example, in one embodiment, the valley 84 can be an uncovered region 86, such that a surface of the superlattice semiconductor layer 72 is exposed. In this manner, the mesa structure 66 formed therebetween can allow for improved light extraction through the uncovered region 86. In another embodiment, the valley 84 can have the reflective layer 78 formed therein with the semiconductor layer 74 and the ohmic layer 76 removed to define a reflection region 88. In this manner, the mesa structure 66 formed between the reflection region 88 can promote reflection. In another embodiment, the valley 84 formed between the mesa 66 can be filled with a light extraction material 90. As used herein, a light extraction material 90 means a material that can promote light extraction therefrom. A dielectric material is an example of a light extraction material. In one embodiment, the light extraction material 90 can include, but is not limited to, $SiO_2$, AlN, ($Al_2O_3$), as well as a light diffusively-reflective material such as an expanded polytetrafluoroethylene (ePTFE) membrane (e.g., GORE® Diffuse Reflector Material), and the like. In one embodiment, the semiconductor layer 74 can contain a superlattice for improved lateral transport of the electrical current. In particular, the distance between the mesas 66 can be selected to facilitate the current spreading throughout the bottom portion of the semiconductor layer 74, and the subsequent semiconductor layer 68 (e.g., a p-type semiconductor layer). In one embodiment, the mesas 66 can be patterned to have a distance between the mesas 66 that is less than a current spreading length of the semiconductor layer 72 or the current spreading length of a layer formed by combining semiconductor layers 72, 70 and 68. To this extent, the superlattice can comprise sublayers of $Al_{x1}In_{y1}Ga_{1-x1-y1}N/Al_{x2}In_{y2}Ga_{1-x2-y2}N$ layers with modulation p-type doping. For example, the p-type doping can be increased in the barrier of the superlattice providing higher mobility of holes along the interface of quantum wells and barriers.

Figure 9:
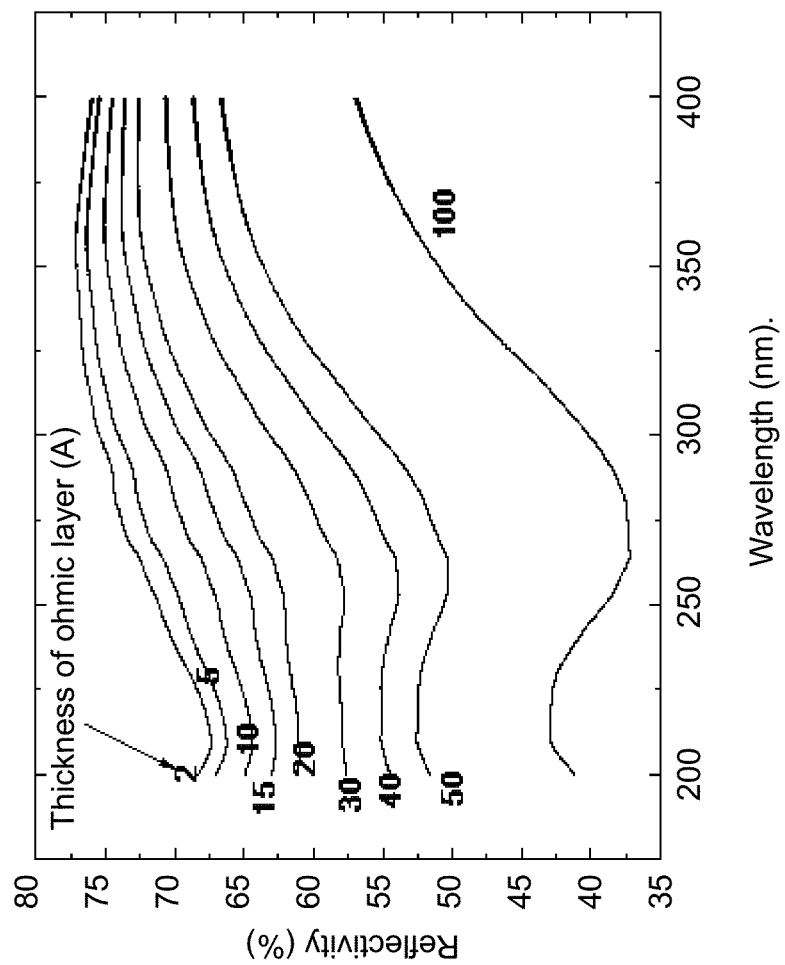
FIG. 9 shows an illustrative graph of an effect of a thickness of the ohmic layer on a reflectivity of the contact for various wavelengths of radiation according to an embodiment.

As described herein, the ohmic layer of the contacts described herein can be sufficiently thin to provide insignificant absorbance of radiation of a target wavelength (e.g., ultraviolet radiation) while providing a reasonably low contact resistance for the contact. FIG. 9 shows an illustrative graph of an effect of a thickness of the ohmic layer on a reflectivity of the contact for various wavelengths of radiation according to an embodiment. In this case, the ohmic layer was formed of nickel. As illustrated, to ensure a reflectivity of at least fifty percent for radiation of any wavelength between 200 and 400 nanometers, the ohmic layer should have a thickness less than approximately 50 Angstroms (A).

Figure 10:
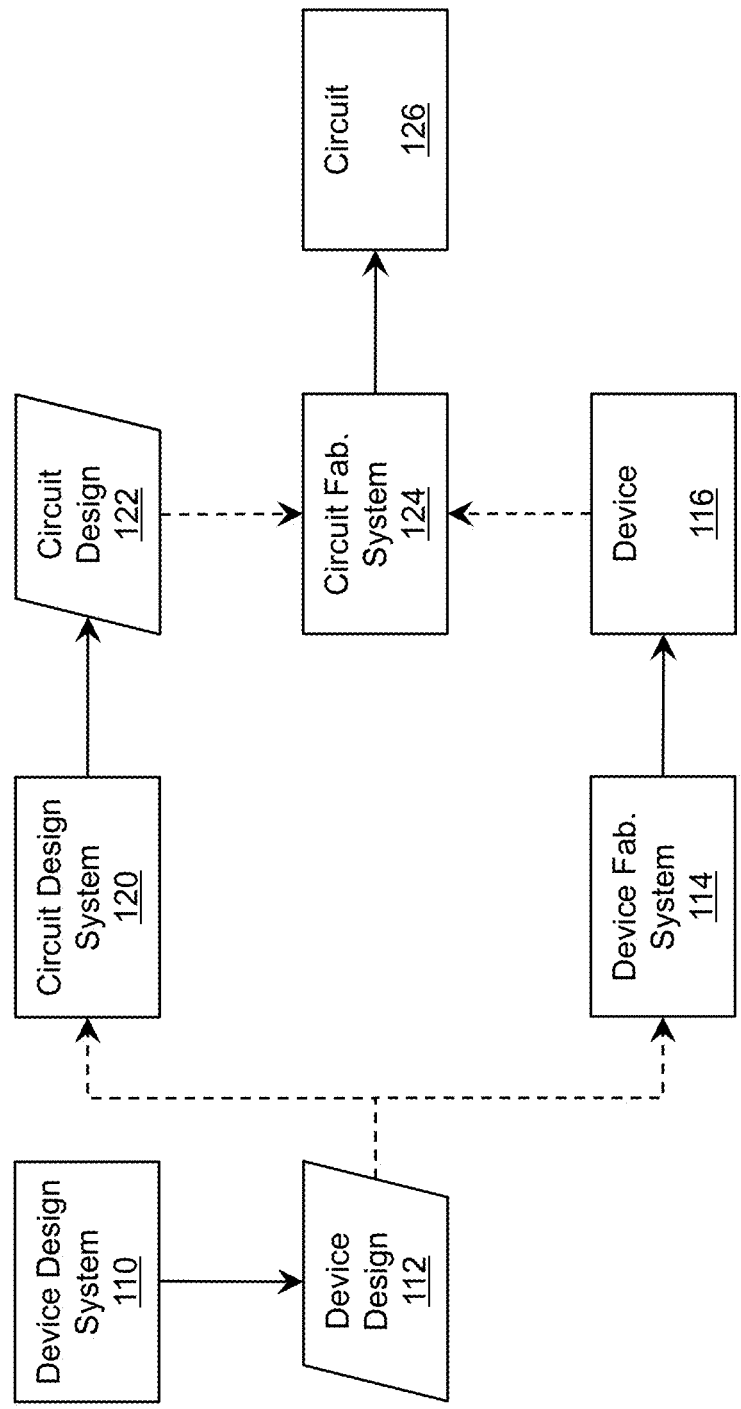
FIG. 10 shows an illustrative flow diagram for fabricating a circuit according to an embodiment.

In one embodiment, the invention provides a method of designing and/or fabricating a circuit that includes one or more of the devices designed and fabricated as described herein (e.g., including one or more contacts configured as described herein). To this extent, FIG. 10 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A contact comprising:
a graded ohmic layer formed from a first metal and a second metal, the graded ohmic layer having a first metal region, a second metal region, and an interface region separating the first metal region and the second metal region, wherein the interface region includes an equal amount of concentration of the first metal and the second metal, the first metal region having a concentration of the first metal that gradually increases in a direction away from the interface region and a concentration of the second metal that gradually decreases in a direction away from the interface region, and the second metal region having a concentration of the first metal that gradually decreases in a direction away from the interface region and a concentration of the second metal that gradually increases in a direction away from the interface region, and wherein the ohmic layer is transparent to radiation having a target wavelength; and
a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

2. The contact of claim 1, further comprising an ohmic protective layer located between the ohmic layer and the reflective layer, wherein the ohmic protective layer is configured to prevent diffusion of the reflective layer into the ohmic layer.

3. The contact of claim 2, wherein the ohmic protective layer comprises rhodium.

4. The contact of claim 1, further comprising a conductive layer located on the reflective layer, wherein the conductive layer is formed of a material having a high electrical conductivity.

5. The contact of claim 4, further comprising a reflector protective layer located between the reflective layer and the conductive layer, wherein the reflector protective layer is configured to prevent diffusion of the conductive layer into the reflective layer.

6. The contact of claim 4, further comprising a dielectric adhesion layer located on the conductive layer, wherein the dielectric adhesion layer is configured to promote adhesion of an insulating dielectric film to the contact.

7. The contact of claim 1, wherein the ohmic layer comprises nickel (Ni).

8. The contact of claim 1, wherein the ohmic layer comprises palladium (Pd).

9. A device comprising:
a first semiconductor layer;
a contact to the first semiconductor layer, wherein the contact includes:
an ohmic layer, wherein the ohmic layer is transparent to radiation having a target wavelength and partially penetrates the first semiconductor layer; and
a reflective layer located on the ohmic layer, wherein the reflective layer is at least approximately eighty percent reflective of radiation having the target wavelength, and wherein the target wavelength is within a range of wavelengths between approximately 260 and approximately 360 nanometers; and
a second semiconductor layer located between the first semiconductor layer and the contact, wherein the second semiconductor layer has a band gap narrower than a band gap of the first semiconductor layer, and wherein the second semiconductor layer has a thickness less than approximately fifty nanometers.

10. The device of claim 9, the contact further including an ohmic protective layer located between the ohmic layer and the reflective layer, wherein the ohmic protective layer is configured to prevent diffusion of the reflective layer into the ohmic layer.

11. The device of claim 9, the contact further including a conductive layer located on the reflective layer, wherein the conductive layer is formed of a material having a high electrical conductivity.

12. The device of claim 9, wherein the ohmic layer covers only a portion of the first semiconductor layer located directly beneath the contact.

13. The device of claim 9, wherein the ohmic layer is formed of a first sub-layer of a first metal and a second sub-layer of a second metal distinct from the first metal.

14. The device of claim 9, wherein the first and second semiconductor layers are formed of group III nitride materials, and wherein the second semiconductor layer has a gallium content of at least eighty percent.

15. The device of claim 9, wherein a surface of the first semiconductor layer below the contact is patterned, wherein the pattern has a nanoscale characteristic size.

16. The device of claim 9, wherein the first semiconductor layer has at least one of: a laterally inhomogeneous electrical conductivity or a laterally inhomogeneous reflectivity.

17. The device of claim 9, wherein the ohmic layer includes a first set of islands and a second set of islands, wherein each of the first set of islands is formed on a surface of the first semiconductor layer and each of the second set of islands is formed over a portion at least one of the islands of the first set of islands and a portion of the surface of the first semiconductor layer that is without contact with the first set of islands.

18. A device comprising:
a first group III nitride semiconductor layer;
a patterned second group III nitride semiconductor layer located on the first semiconductor layer, wherein the second semiconductor layer has a band gap narrower than a band gap of the first semiconductor layer, and wherein the second semiconductor layer has a thickness less than approximately fifty nanometers; and
a contact located on the second semiconductor layer, wherein the contact includes:
an ohmic layer, wherein the ohmic layer is transparent to radiation having a target wavelength, the ohmic layer including a first set of islands and a second set of islands, wherein each of the first set of islands is formed on a surface of the first semiconductor layer and each of the second set of islands is formed over a portion at least one of the islands of the first set of islands and a portion of the surface of the first semiconductor layer that is without contact with the first set of islands; and
a reflective layer located on the ohmic layer, wherein the reflective layer is at least approximately eighty percent reflective of radiation having the target wavelength, and wherein the target wavelength is within a range of wavelengths between approximately 260 and approximately 360 nanometers.

19. The device of claim 18, the contact further including a conductive layer located on the reflective layer, wherein the conductive layer is formed of a material having a high electrical conductivity.

20. The device of claim 18, wherein the device is configured to operate as a deep ultraviolet light emitting device.

* * * * *